US011991840B2

(12) United States Patent
Lin et al.

(10) Patent No.: US 11,991,840 B2
(45) Date of Patent: May 21, 2024

(54) ELECTRONIC DEVICE

(71) Applicant: Delta Electronics, Inc., Taoyuan (TW)

(72) Inventors: Chia-Yuan Lin, Taoyuan (TW);
Chih-Yuan Hsu, Taoyuan (TW);
Chung-Chieh Cheng, Taoyuan (TW)

(73) Assignee: DELTA ELECTRONICS, INC.,
Taoyuan (TW)

( * ) Notice: Subject to any disclaimer, the term of this patent is extended or adjusted under 35 U.S.C. 154(b) by 83 days.

(21) Appl. No.: 17/567,601

(22) Filed: Jan. 3, 2022

(65) Prior Publication Data
US 2023/0058284 A1 Feb. 23, 2023

(30) Foreign Application Priority Data

Aug. 17, 2021 (CN) .......................... 202110943154.4

(51) Int. Cl.
*H05K 5/02* (2006.01)
*H05K 5/00* (2006.01)
(52) U.S. Cl.
CPC ......... *H05K 5/0017* (2013.01); *H05K 5/0221* (2013.01)
(58) Field of Classification Search
CPC ... H05K 5/0017; H05K 5/0221; H05K 5/0217
See application file for complete search history.

(56) References Cited

U.S. PATENT DOCUMENTS

| 5,771,207 | A | * | 6/1998 | Muroi | ................ | H01H 43/022 |
|||||||368/10|
| 6,821,134 | B2 | * | 11/2004 | Chen | ..................... | H01R 35/04 |
|||||||439/11|
| 6,827,581 | B2 | * | 12/2004 | Ho | ........................ | H01R 35/04 |
|||||||248/921|
| 7,377,603 | B2 | | 5/2008 | Quijano | | |
| 2005/0243106 | A1 | * | 11/2005 | Bae | .................... | H05K 7/20963 |
|||||||361/728|

(Continued)

FOREIGN PATENT DOCUMENTS

| CN | 1760795 B | 9/2010 |
|---|---|---|
| CN | 101738520 B | 8/2012 |

(Continued)

OTHER PUBLICATIONS

Google translation of CN 213576957 (Year: 2023).*

(Continued)

*Primary Examiner* — Sagar Shrestha
(74) *Attorney, Agent, or Firm* — Chun-Ming Shih; HDLS IPR SERVICES

(57) ABSTRACT

This disclosure is directed to an electronic device having a casing, a circular frame, and a display. A panel is arranged on one side of the casing, a circular opening is defined on the panel, and a first fixing structure is arranged on an inner edge of the circular opening. The circular frame is rotatably arranged in the circular opening to close the circular opening, a second fixing structure is arranged on an outer edge of the circular frame, and the second fixing structure is limited by the first fixing structure. The display is embedded in the circular frame and exposed on the panel, so that the display is rotatable according to various placing positions of the casing.

13 Claims, 14 Drawing Sheets

(56) References Cited

U.S. PATENT DOCUMENTS

| | | | | |
|---|---|---|---|---|
| 2012/0120581 A1* | 5/2012 | Haren | ............... | G06F 1/1632 |
| | | | | 361/679.21 |
| 2012/0244730 A1* | 9/2012 | Grimm | ............ | H05K 5/0004 |
| | | | | 439/142 |
| 2015/0187521 A1* | 7/2015 | Chu | ................ | H01H 19/115 |
| | | | | 200/4 |
| 2015/0351267 A1* | 12/2015 | Shah | ................. | H05K 7/186 |
| | | | | 312/309 |
| 2017/0196106 A1* | 7/2017 | Zhu | ................. | H05K 5/0247 |
| 2019/0198202 A1* | 6/2019 | Stottinger | ............ | G05G 1/10 |
| 2019/0301744 A1* | 10/2019 | Yang | ................. | F24C 3/122 |
| 2020/0253073 A1* | 8/2020 | Cui | ................. | G05G 1/02 |
| 2021/0122529 A1* | 4/2021 | Driscoll | ........... | H01H 43/028 |
| 2021/0378110 A1* | 12/2021 | Kish | ................ | H05K 5/0226 |

FOREIGN PATENT DOCUMENTS

| | | | | |
|---|---|---|---|---|
| CN | 213576957 | * | 6/2021 | ............ F21S 4/24 |
| JP | 2003262913 A | | 9/2003 | |
| JP | 2016187297 A | | 10/2016 | |

OTHER PUBLICATIONS

Office Action dated Jan. 10, 2023 of the corresponding Japan patent application No. 2022-000681.

Search Report dated Jul. 5, 2022 of the corresponding European patent application No. 22150351.9.

Office Action dated Mar. 15, 2022 of the corresponding Taiwan patent application No. 110130284.

* cited by examiner

ELECTRONIC DEVICE

BACKGROUND OF THE DISCLOSURE

Technical Field

The disclosure is directed to an electronic device, in particular to an electronic device having a display which is rotatable corresponding to various placing positions of the electronic device.

Description of Related Art

Most of related small or medium electronic devices such as uninterruptible power devices, power supplies, network routers, network access points, set-top boxes, barebone computers are of flat cuboid shape, and the electronic devices may be laid flat or kept up-right according to the installed space. Some small or medium electronic devices are provided with a display for displaying the status information of the electronic device, and the display may be disposed cooperatively with an operation interface for operating the electronic device. However, the display cannot be rotated corresponding to various directions of placements of the electronic device. For the various directions of placements of the electronic device, a related electronic device is provided with a square display, and the display can be disposed in a direction corresponding to the placement of the electronic device when the electronic device is installed. However, it is inconvenient to detach the display, and inner circuit may be exposed through a hole for installing the display and cause an electric shock to a user when the display is detached. In addition, more compact design and higher cost may be necessary in order to satisfy the requirements of safety regulations.

In view of the above drawbacks, the inventor proposes this disclosure based on his expert knowledge and elaborate researches in order to solve the problems of related art.

SUMMARY OF THE DISCLOSURE

This disclosure is directed to an electronic device having a display which is rotatable according to various placing positions of the electronic device without detaching the display.

This disclosure is directed to an electronic device having a casing, a circular frame, and a display. The casing has a panel arranged on a side of the casing and a plurality of side plates adjacent to a periphery of the panel, a circular opening is defined on the panel, and a first fixing structure is arranged on an internal edge of the circular opening. The circular frame is rotatably arranged on the circular opening and closes the circular opening, a second fixing structure is arranged on an external edge of the circular frame, the second fixing structure is slidable with the circular frame and limited by the first fixing structure. The display is embedded in the circular frame and exposed on the panel. When any one of the side plates is configured as a bottom of the casing, a placing position is defined corresponding to any one of the side plates as the bottom, and the circular frame is rotatable to make a direction of the display be corresponding to the placing position.

According to the electronic device of this disclosure, the circular frame protrudes from the panel. An operating interface is arranged on the circular frame. The casing is of a cuboid shape and the panel is of a rectangular shape.

According to the electronic device of this disclosure, the first fixing structure may have a sliding latch, the second fixing structure may have a curve slot arranged concentrically with the circular frame, and the sliding latch snaps the curve slot. The second fixing structure may have a sliding latch, the first fixing structure may have a curve slot arranged concentrically with the circular opening, and the sliding latch snaps the curve slot. Alternatively, the first fixing structure may have a sliding latch and the second fixing structure may correspondingly have a curve slot arranged concentrically with the circular frame, the second fixing structure may have another sliding latch and the first fixing structure may correspondingly have another curve slot arranged concentrically with the circular opening, and each sliding latches correspondingly snap each respective curve slot.

According to the electronic device of this disclosure, a first positioning structure is arranged on the internal edge of the circular opening, a second positioning structure is arranged on the external edge of the circular frame, the circular frame is rotatable with respect to the circular opening to one of a plurality of predetermined positions corresponding to the placing position, the first positioning structure and the second positioning structure block each other along a circumferential direction of the circular opening when the circular frame is located in any one of the predetermined positions. When the circular frame is located at one of the predetermined positions, the first positioning structure and the second positioning structure are buckled with each other along the circumferential direction of the circular opening. When the circular frame is located at any one of the predetermined positions, the first positioning structure and the second positioning structure are buckled with each other along an axial direction of the circular opening. The first positioning structure may have a spherical tenon, and the second positioning structure may have a positioning hole buckled with the spherical tenon. Alternatively, the second positioning structure may have a spherical tenon, and the first positioning structure may have a positioning hole buckled with the spherical tenon.

According to the electronic device of this disclosure, the circular frame is rotatable from any one of the predetermined positions to another predetermined position through an angle in multiples of 90 degrees.

According to the electronic device of this disclosure, the first positioning structure and the second positioning structure respectively have a block, when the circular frame is located at one of the predetermined positions, two blocks abut against each other and block each other unidirectionally along a circumferential direction of the circular opening.

According to the electronic device of this disclosure, the display is rotatably arranged in the circular opening of the casing via the circular frame. Accordingly, the display may be rotatable according to various placing positions of the casing to facilitate the usage for a user.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

According to the first embodiment shown in FIG. 1 to FIG. 6, an electronic device having a casing 100, a circular frame 200 and a display 310 is provided.

Figure 6:
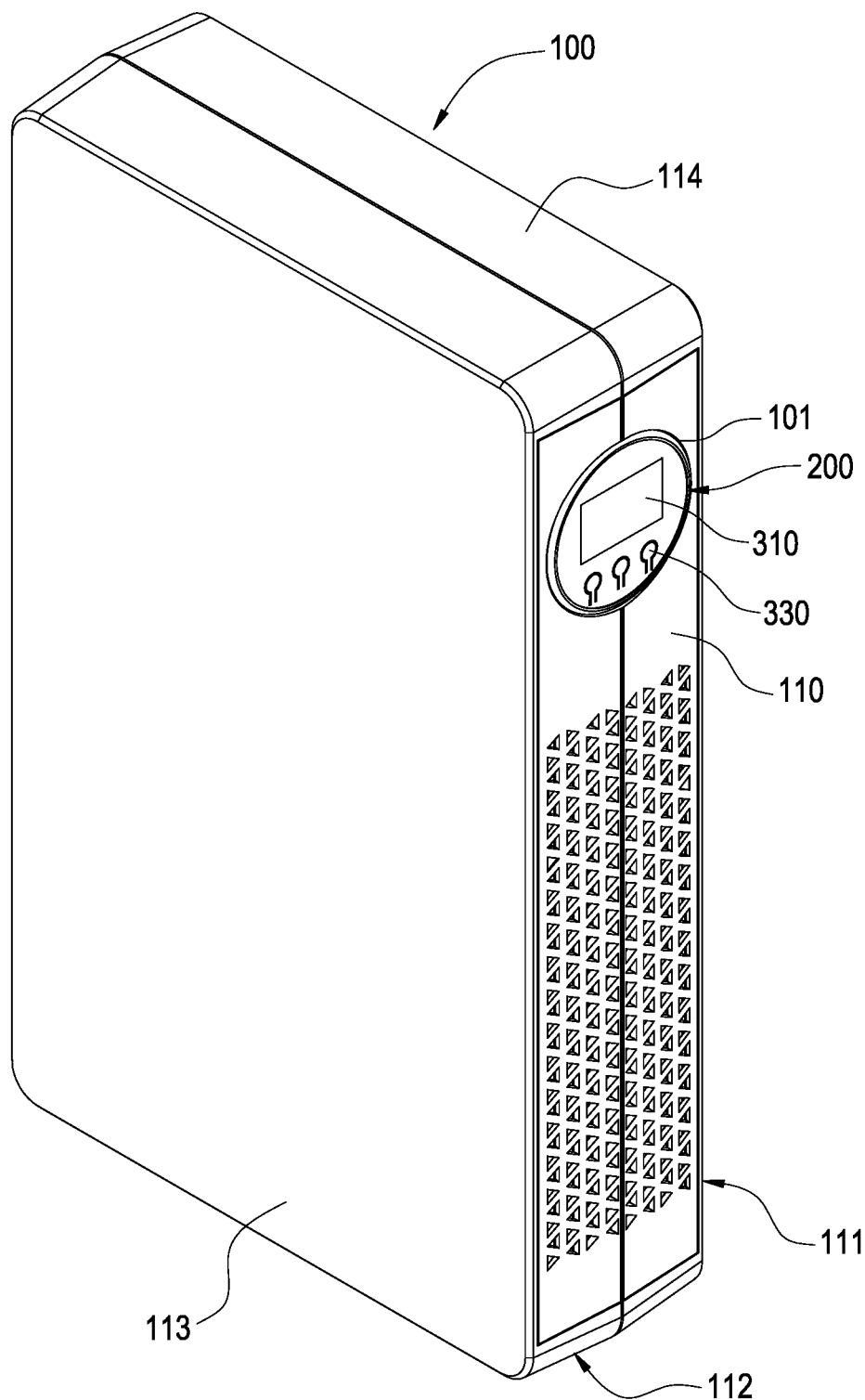
FIG. 6 is a perspective view showing the electronic device configured in another placing position according to the first embodiment of this disclosure.

The casing 100 is of a cuboid shape, a panel 110 is arranged on a side of the casing 100, and the panel 110 is of a rectangular shape. The casing 100 has a plurality of side plates adjacent to a periphery of the panel 110, the casing 100 may be placed in a manner of any one of a plurality of placing positions corresponding to one of the side plates 111, 112. The casing 100 according to this embodiment has two side plates 111, 112 as the bottom corresponding to two placing positions. Accordingly, the casing 100 may be placed in a manner of the first placing position, and the first side plate 111 is configured as the bottom. Moreover, the casing 100 may stand in a manner of the second placing position as shown in FIG. 6, and the second side plate 112 is configured as the bottom. A circular opening 101 is defined on the panel 110, and a first fixing structure 120 is arranged on an internal edge of the circular opening 101.

Figure 2:
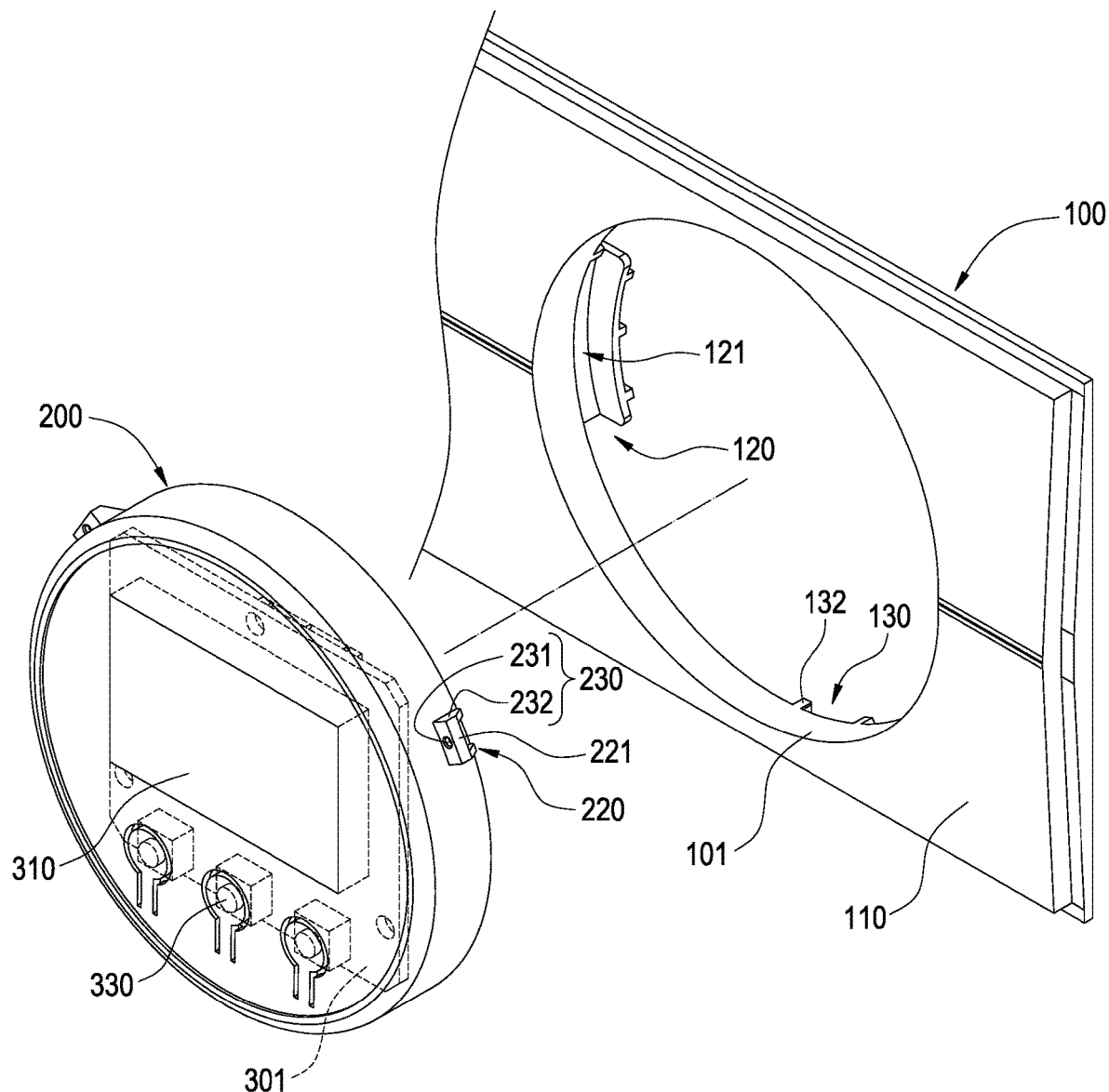
FIG. 2 and FIG. 3 are exploded views showing the electronic device according to the first embodiment of this disclosure.
Figure 3:
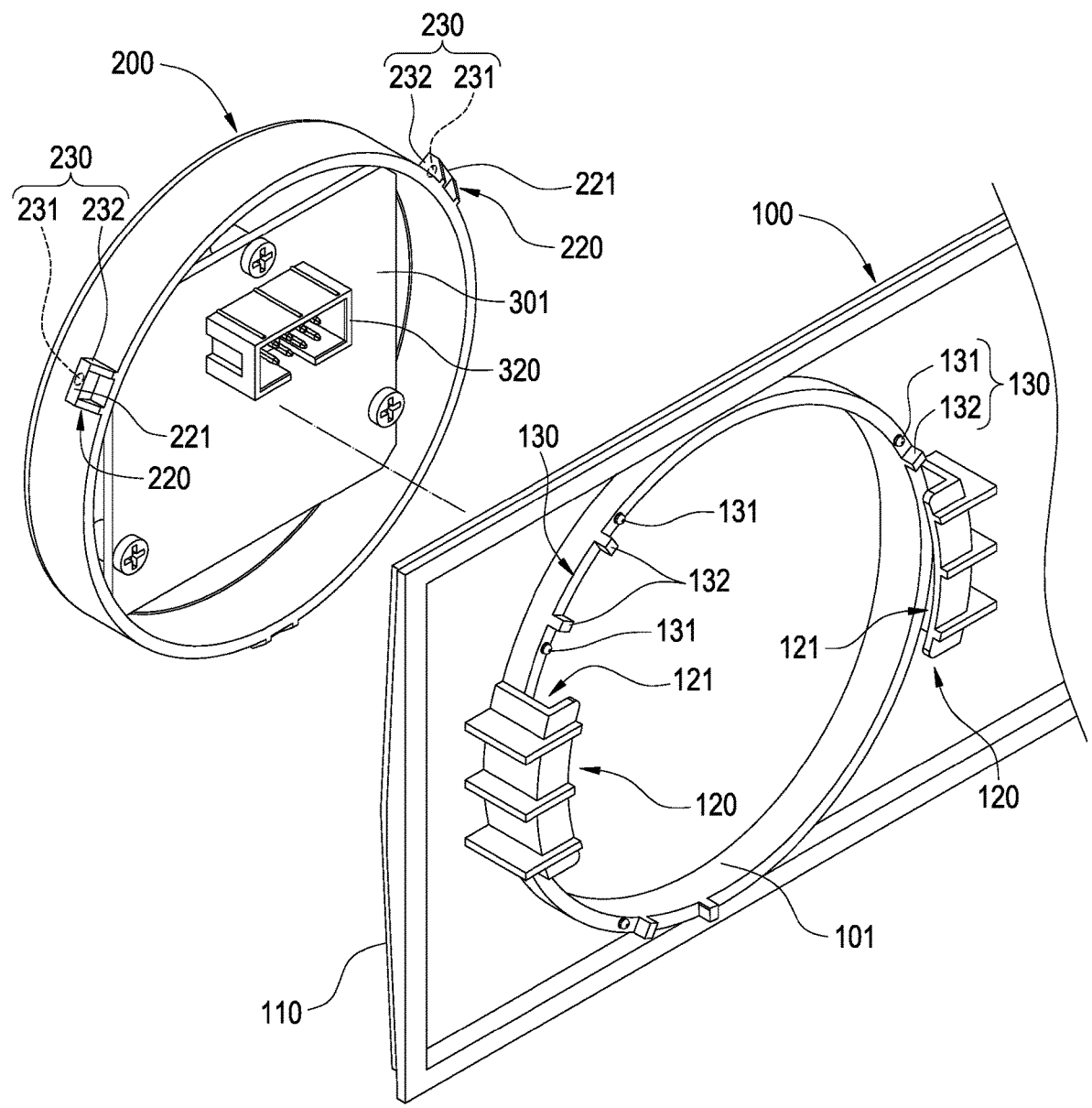
Figure 4:
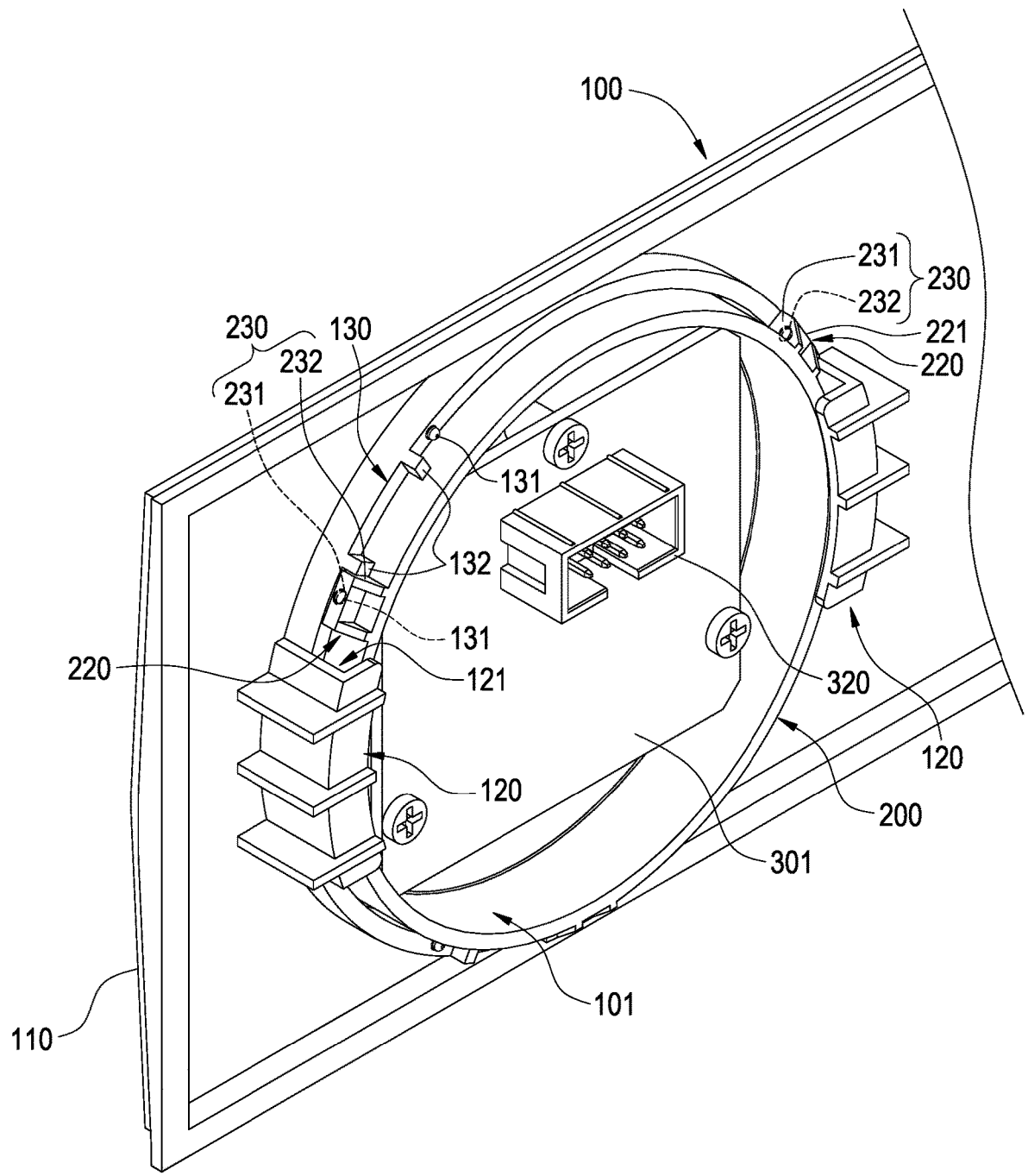
FIG. 4 is a perspective view showing a circular frame at one predetermined position according to the first embodiment of this disclosure.

According to FIG. 2 to FIG. 4, the circular frame 200 may be a circular ring, a circular plate or a cylinder, an exterior profile of the circular frame 200 is matched with an interior profile of the circular opening 101, the circular frame 200 is rotatably arranged in the circular opening 101 to close the circular opening 101. According to this embodiment, the circular frame 200 may be protruded from the panel 110 to facilitate the usage for a user of rotating the circular frame 200, but this disclosure is not limited to this embodiment. For example, the circular frame 200 may be disposed in a coplanar manner with the panel 110 or be recessed in the circular opening 101. A second fixing structure 220 is arranged at an external edge of the circular frame 200, the second fixing structure 220 is annularly arranged at a circular external edge of the circular frame 200 corresponding to the first fixing structure 120, and the second fixing structure 220 is slidable with the circular frame 200 and limited in the first fixing structure 120. Therefore, the circular frame 200 is limited at the circular opening 101 of the panel 110 of the casing 100. Furthermore, the second fixing structure 220 on the periphery of the circular frame 200 is slidable along a circumferential direction in the first fixing structure 120, and the circular frame 200 is rotatable relative to the circular opening 101. According to this embodiment, the second fixing structure 220 is annularly arranged on a circular profile defined by the circular external edge of the circular frame 200 corresponding to the first fixing structure 120, but this disclosure is not limited to this embodiment.

Specific structures of the first fixing structure 120 and the second fixing structure 220 are described as follows. According to this embodiment, the first fixing structure 120 has a curve slot 121, the second fixing structure 220 has a sliding latch 221 arranged concentrically with the circular frame 200, and the sliding latch 221 is latched to the curve slot 121. When the circular frame 200 rotates in the circular opening 101, the sliding latch 221 is slidable in the curve slot 121 to avoid the interference to a rotation of the circular frame 200.

Figure 1:
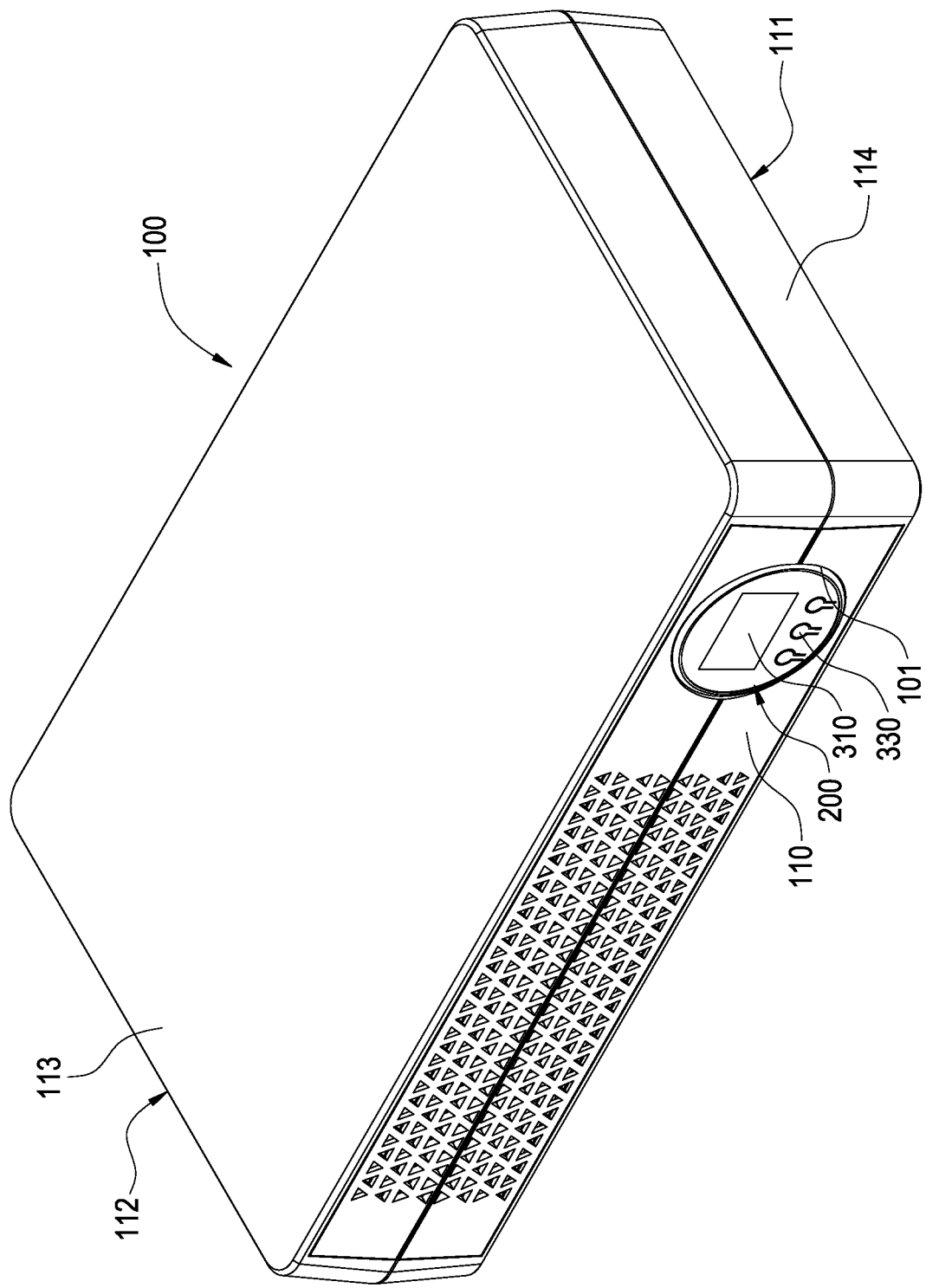
FIG. 1 is a perspective view showing an electronic device configured in one placing position according to the first embodiment of this disclosure.

According to FIGS. 1 to 2, the display 310 is embedded in the circular frame 200 and exposed on the panel 110, the display 310 may be provided with an electric connector 320 for electrically connecting to a main board (not shown in figures) of an electronic device via a cable (not shown in figures) to display information related to status of the electronic device, and an operating interface 330 electrically connected with the main board is arranged on the circular frame 200 for an operation to the electronic device by the user. The display 310, the electric connector 320 and the operating interface 330 may be arranged on a sub circuit board 301. The type of the operating interface 330 is not limited in this disclosure. For example, the operating interface 330 may be physical keys or a touch screen integrated with the interface display 310.

According to FIG. 2 to FIG. 4, in order to limit the rotation of the circular frame 200, a first positioning structure 130 is arranged on the internal edge of the circular opening 101, a second positioning structure 230 is correspondingly arranged at the external edge of the circular frame 200. The circular frame 200 is rotatable relative to the circular opening 101 to one of the predetermined positions, and the circular frame 200 may be rotated from any one of the predetermined positions to another predetermined position through an angle in multiples of 90 degrees. When the circular frame 200 is located at any one of the predetermined positions, the first positioning structure 130 and the second positioning structure 230 may block each other along a circumferential direction of the circular opening 101 to prevent the circular frame 200 from an unexpected displacement.

Figure 5:
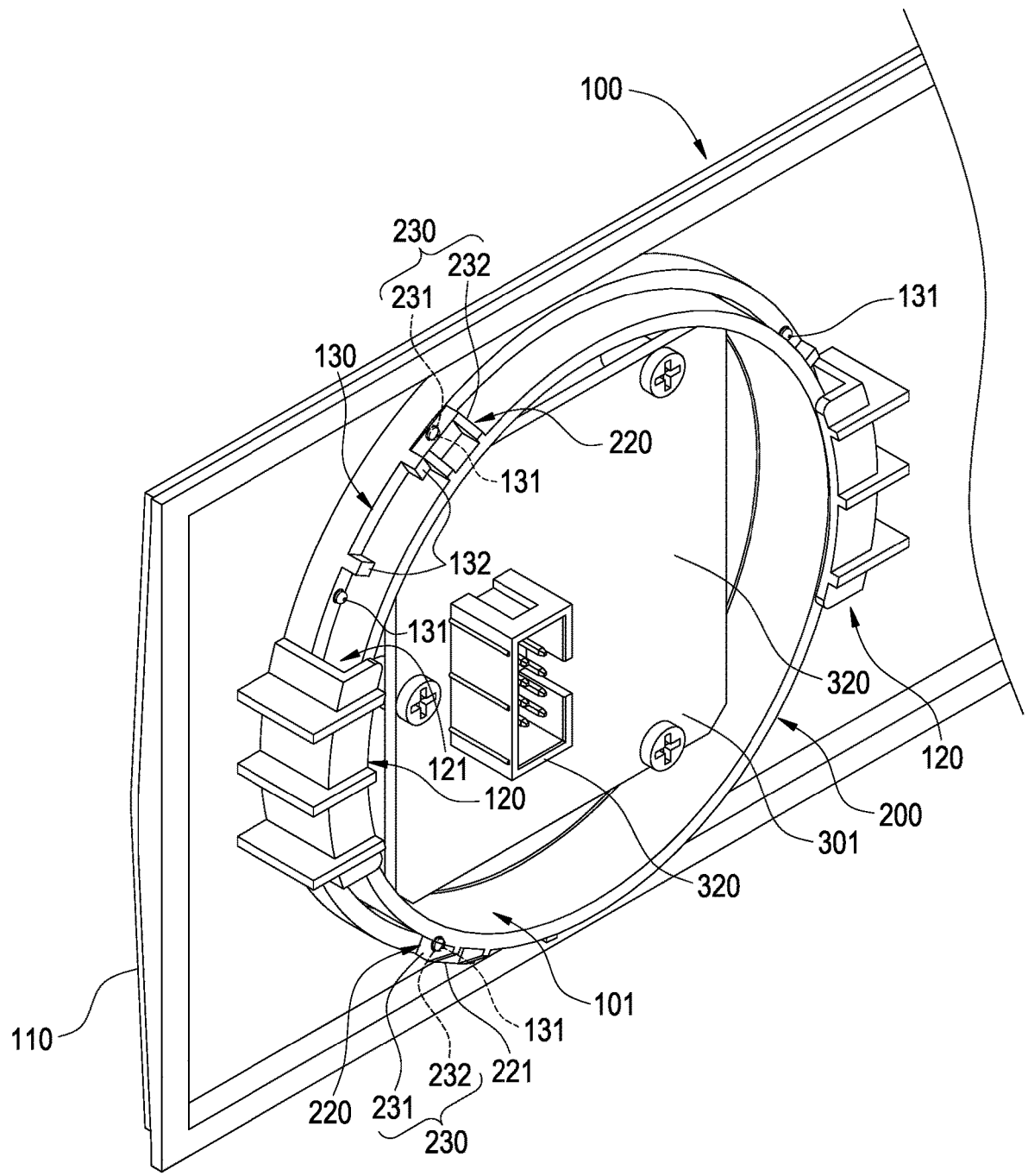
FIG. 5 is a perspective view showing the circular frame at another predetermined position according to the first embodiment of this disclosure.

The circular frame 200 is limited by the first positioning structure 130 and the second positioning structure 230 to be rotatable relative to the circular opening 101 between the first predetermined position shown in FIG. 1 to FIG. 4 and the second predetermined position shown in FIG. 5 to FIG. 6. According to FIG. 1, when the casing 100 is placed at a flat status and the first side plate 111 is configured as the bottom, the circular frame 200 may be correspondingly rotated to the first predetermined position, so that an operator may squarely watch the display 310. According to FIG. 6, when the casing 100 is kept in an up-right status and the second side plate 112 is configured as the bottom, the circular frame 200 may be correspondingly rotated to the second predetermined position, so that the operator may squarely watch the display 310.

The casing 100 is rotated through an angle in multiples of 90 degrees when being rotated to shift between the plurality of flat and up-right placing positions. According to the aforementioned embodiment, the two side plates 111, 112 are arranged adjacently and perpendicularly to each other, and the circular frame 200 may be rotated between the two predetermined positions in an angle of 90 degrees correspondingly. However, the rotating angle is not limited in this disclosure. For example, the casing 100 may have two side plates parallel with each other 111, 113 (or 112, 114) used for the bottom, and the circular frame 200 may be rotated between the two predetermined positions in an angle of 180 degrees correspondingly. Furthermore, number of the predetermined positions is not limited in this disclosure either. For example, the casing 100 may have three adjacent side plates 111, 112, 113 used for the bottom, the circular frame 200 may be rotated to three predetermined positions, and the rotating angles of 90 degrees are disposed between adjacent predetermined positions correspondingly.

According to the electronic device of this disclosure, the first positioning structure 130 and the second positioning structure 230 may respectively have a block 132/232, when the circular frame 200 is located at a predetermined position which is at an end of a rotatable range, the pair of blocks 132/232 abut against each other and stop each other unidirectionally along the circumferential direction of the circular opening 101 so as to prevent the cable from a damage caused by over twisting when the circular frame 200 is rotated out of a predetermined range.

Furthermore, the first positioning structure 130 may have a spherical tenon 131, and the second positioning structure 230 may have a positioning hole 231 for snapping the spherical tenon 131. When the circular frame 200 is located at any one of the predetermined positions in the rotatable range, the spherical tenon 131 snaps the positioning hole 231 along a direction parallel with a central axis of the circular opening 101, so that the circular frame 200 is positioned by the first positioning structure 130 and the second positioning structure 230 to be prevented from an unexpected rotation. The aforementioned spherical tenon 131 and the positioning hole 231 may be exchanged in position, namely the second positioning structure 230 may have a spherical tenon 131 and the first positioning structure 130 may have a positioning hole 231 for snapping the spherical tenon 131. Multiple spherical tenons 131 or multiple positioning holes 231 may be arranged according to an arrangement of the predetermined positions. A function of the spherical tenon 131 is that the spherical tenon 131 may slip out of the snapped positioning hole 231 to allow the rotation of the circular frame 200 when the user rotates the circular frame 200 with a sufficient torque.

According to the second embodiment of this disclosure, an electronic device having a casing 100, a circular frame 200 and a display 310 is provided. The second embodiment is similar to the first embodiment shown in FIG. 1.

The casing 100 is of a cuboid shape, a panel 110 is arranged on a side of the casing 100, and the panel 110 is of a rectangular shape. A circular opening 101 is defined on the panel 110, and a first fixing structure 120 is arranged at an internal edge of the circular opening 101.

Figure 7:
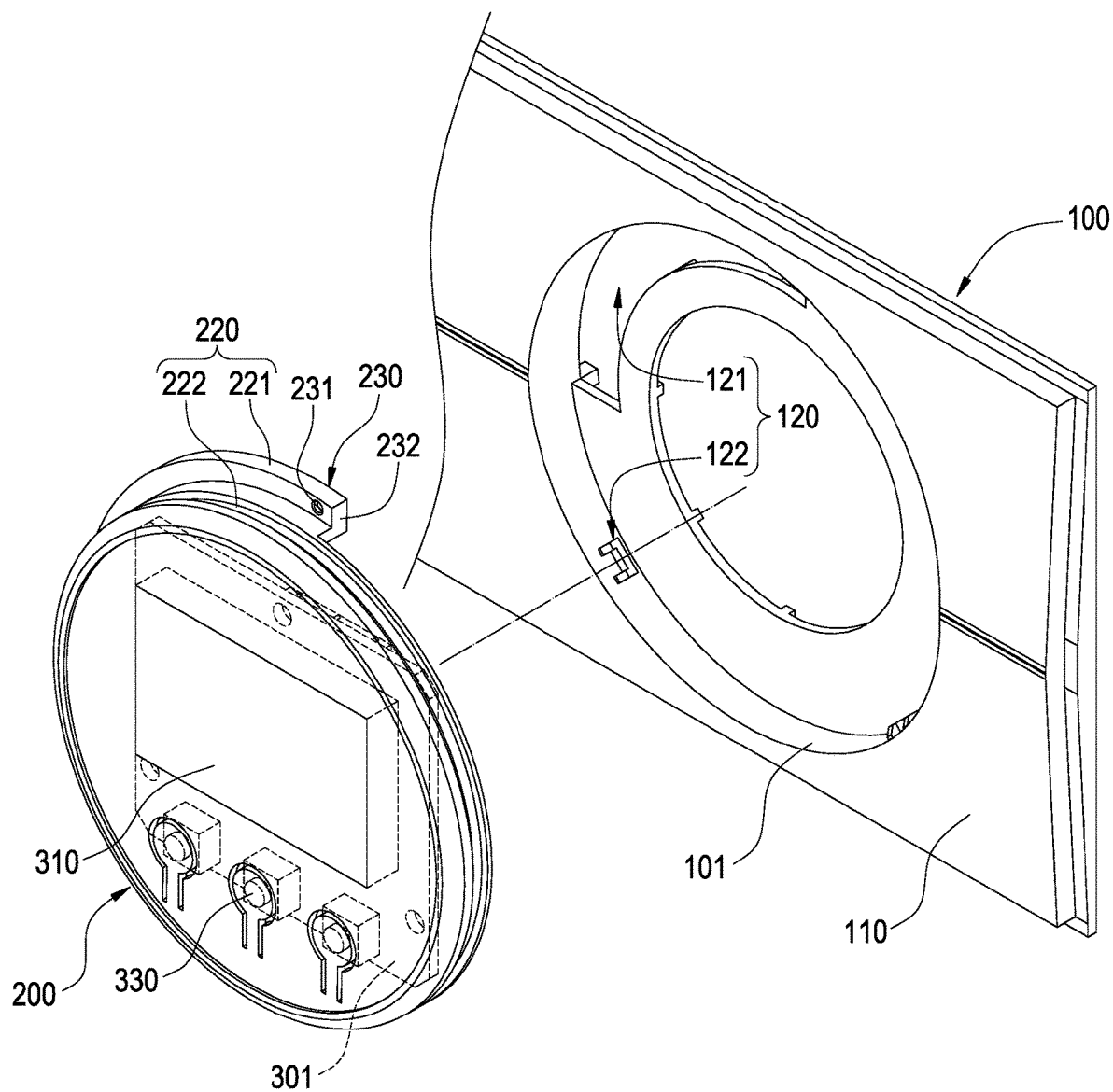
FIG. 7 and FIG. 8 are exploded views showing the electronic device according to the second embodiment of this disclosure.
Figure 8:
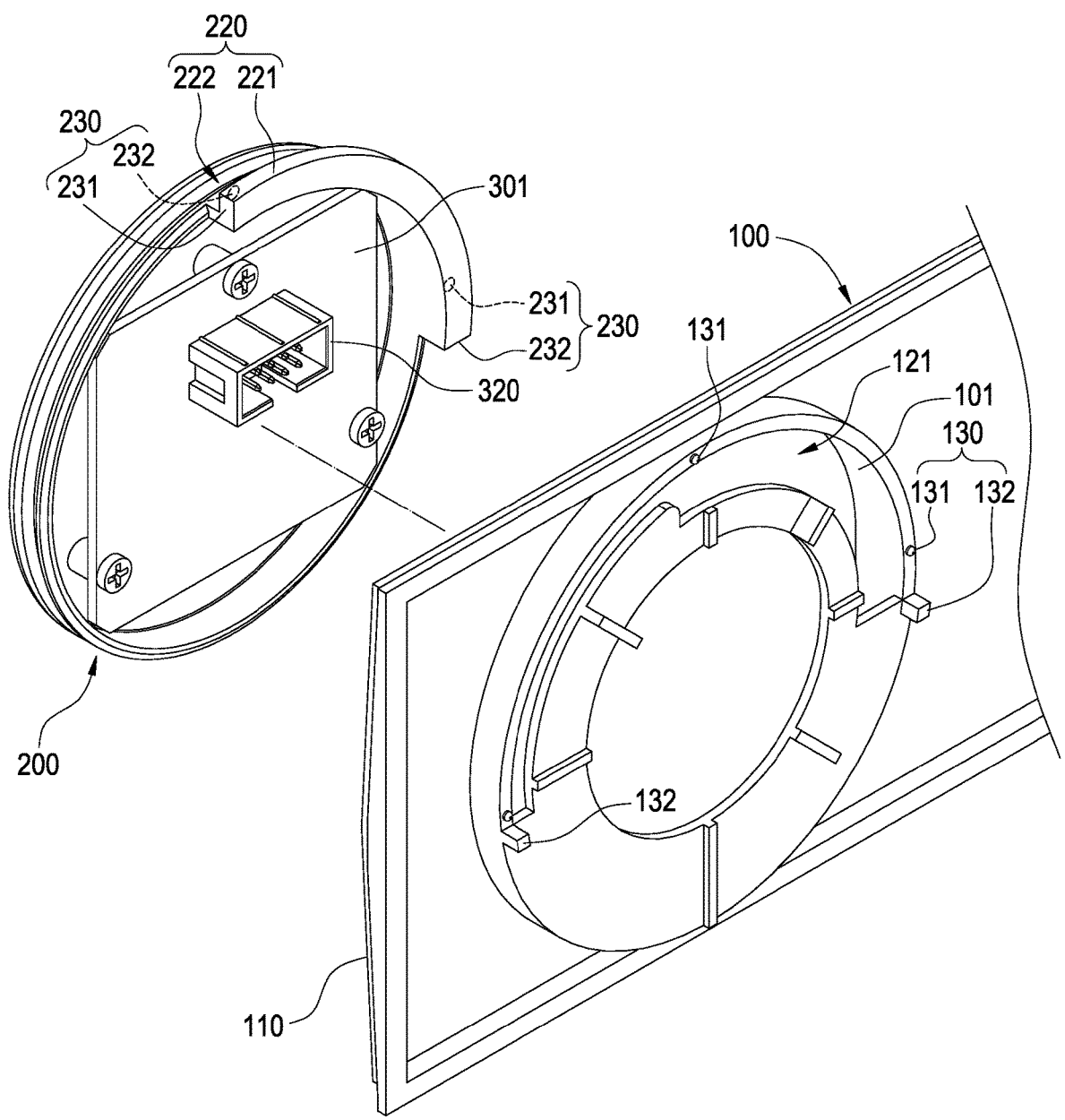
Figure 9:
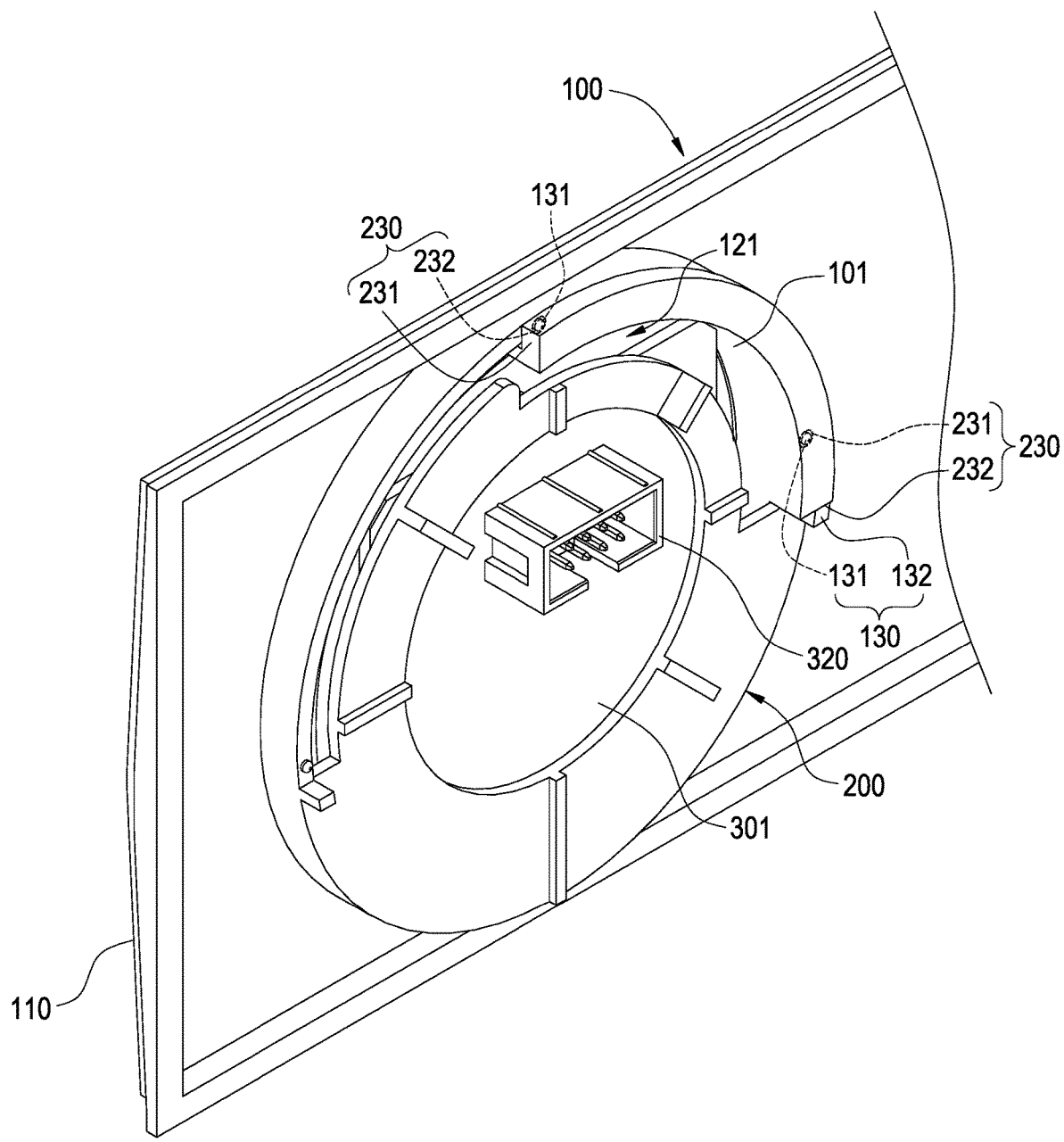
FIG. 9 is a perspective view showing the circular frame at one predetermined position according to the second embodiment of this disclosure.

According to FIG. 7 to FIG. 9, the circular frame 200 may be a circular ring, a circular plate or a cylinder, an exterior profile of the circular frame 200 is matched with an interior profile of the circular opening 101, the circular frame 200 is rotatably arranged in the circular opening 101 to close the circular opening 101. According to this embodiment, the circular frame 200 may be protruded from the panel 110 to facilitate the usage for the user of rotating the circular frame 200, but this disclosure is not limited to this embodiment. For example, the circular frame 200 may be disposed in a coplanar manner with the panel 110 or be recessed in the circular opening 101. A second fixing structure 220 is arranged at an external edge of the circular frame 200, the second fixing structure 220 snaps the first fixing structure 120 to fix the circular frame 200 on the casing 100.

Specific structures of the first fixing structure 120 and the second fixing structure 220 are described as follows. According to this embodiment, the first fixing structure 120 has a sliding latch 122, and the second fixing structure 220 correspondingly has a curve slot 222 arranged concentrically with the circular frame 200. The second fixing structure 220 further has a sliding latch 221, the sliding latch 221 is extended of a curved shape according to this embodiment. The first fixing structure 120 correspondingly has a curve slot 121 arranged concentrically with the circular opening 101. The sliding latches 122, 221 respectively snap each curve slot 222/121 to fix the circular frame 200 on the casing 100. When the circular frame 200 is rotated in the circular opening 101, each sliding latch 122/221 is slidable in each corresponding curve slot 222/121 to avoid the interference to a rotation of the circular frame 200.

The display 310 is embedded in the circular frame 200 and exposed on the panel 110, the display 310 may be provided with an electric connector 320 for electrically connecting to a main board (not shown in figures) of an electronic device via a cable (not shown in figures) to display information related to status of the electronic device, and an operating interface 330 electrically connected with the main board is arranged on the circular frame 200 for an operation to the electronic device by the user. The display 310, the electric connector 320 and the operating interface 330 may be arranged on a sub circuit board 301. The type of the operating interface 330 is not limited in this disclosure. For example, the operating interface 330 may be physical keys or a touch screen integrated with the interface display 310.

Figure 10:
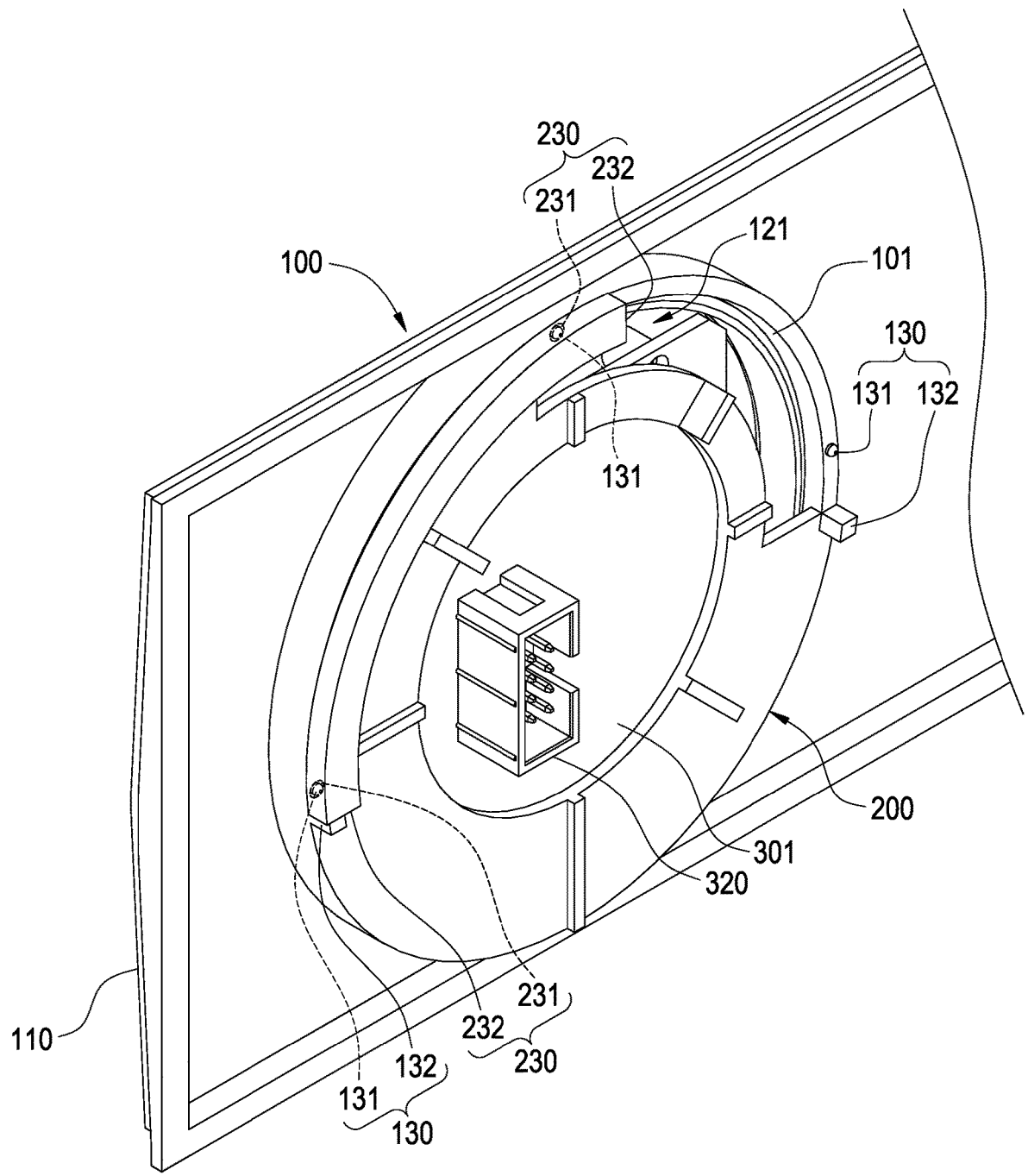
FIG. 10 is a perspective view showing the circular frame at another predetermined position according to the second embodiment of this disclosure.
Figure 11:
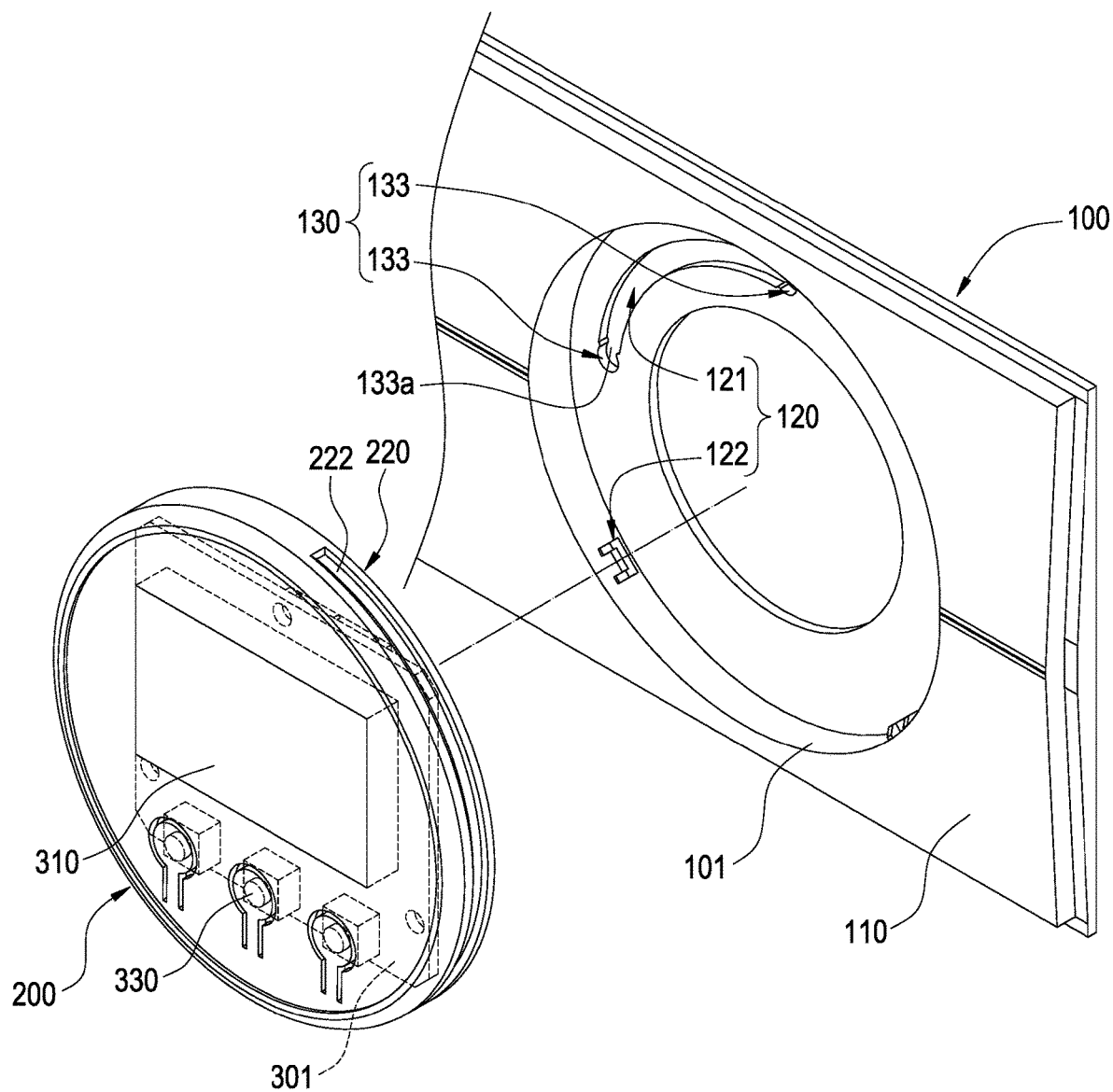
FIG. 11 and FIG. 12 are exploded views showing the electronic device according to the third embodiment of this disclosure.
Figure 12:
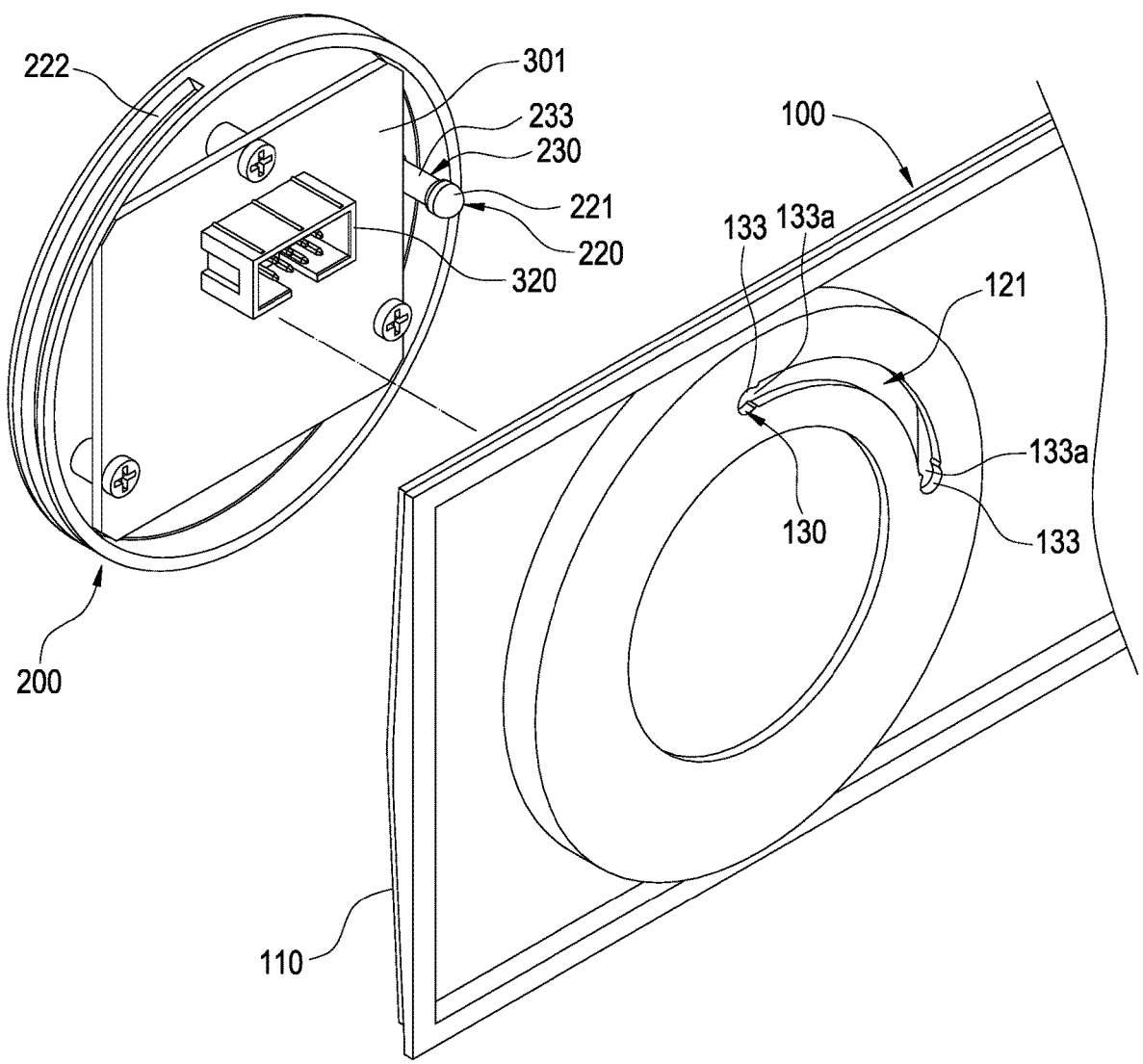
Figure 13:
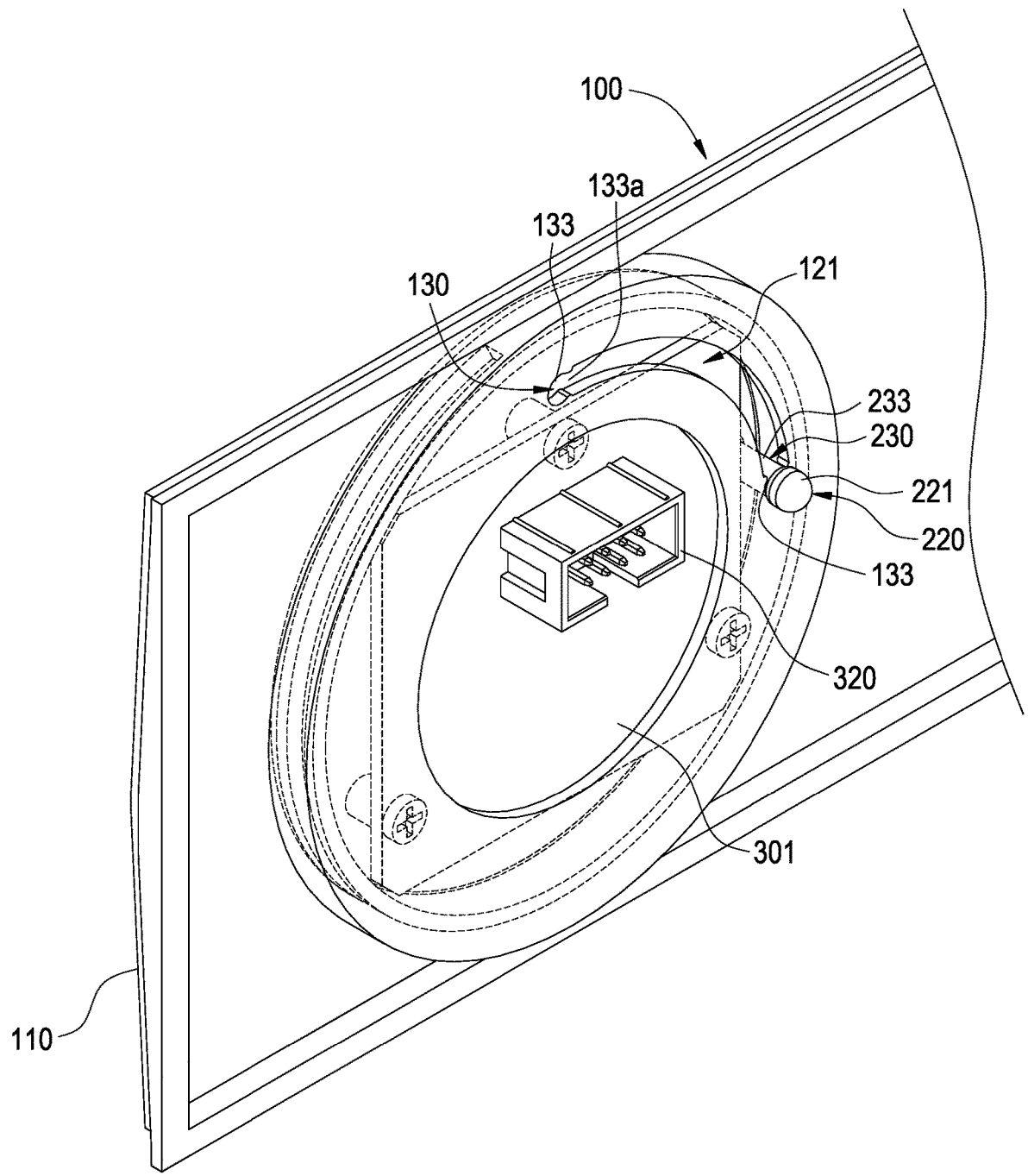
FIG. 13 is a perspective view showing the circular frame at one predetermined position according to the third embodiment of this disclosure.
Figure 14:
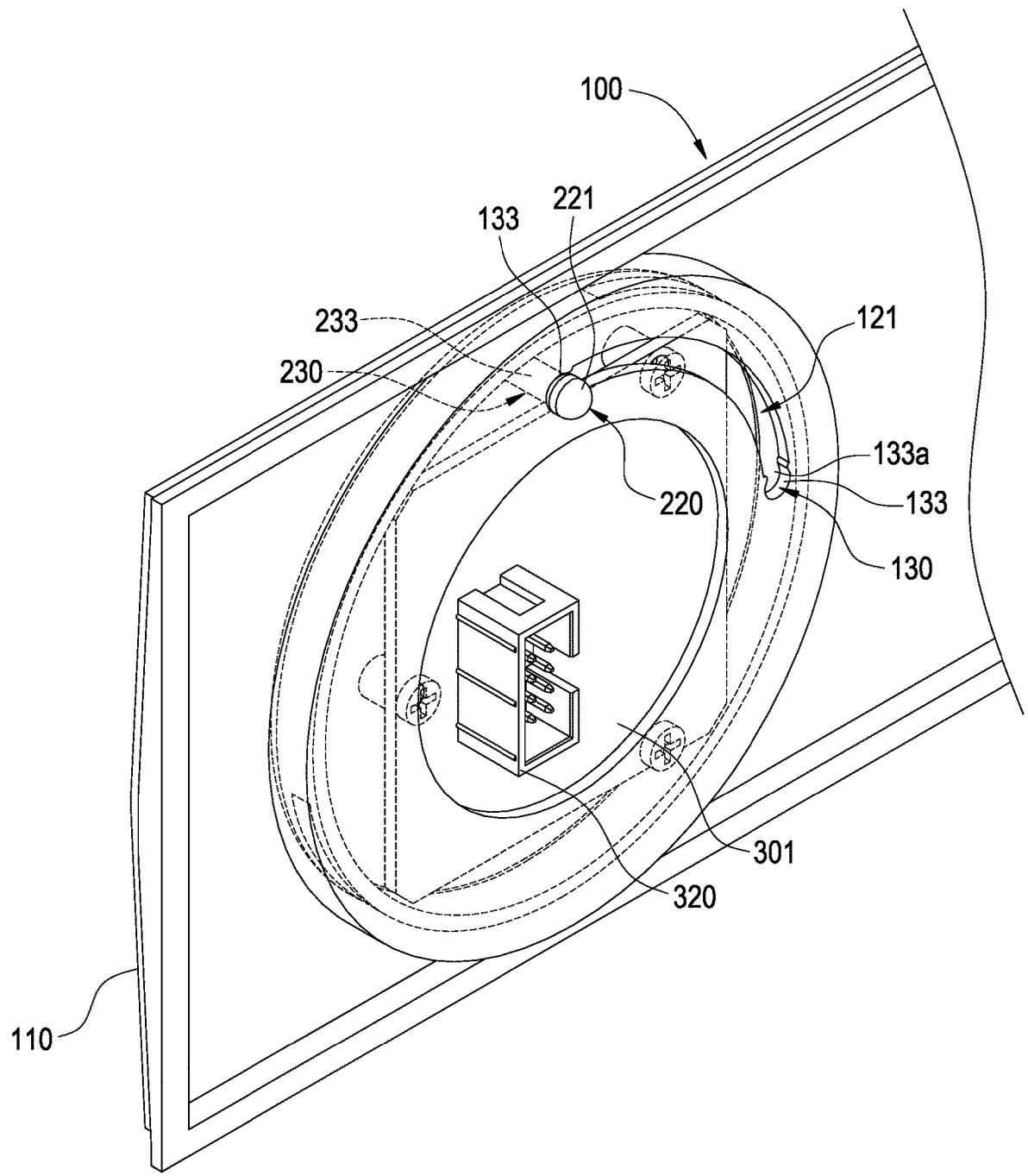
FIG. 14 is a perspective view showing the circular frame at another predetermined position according to the third embodiment of this disclosure.

In order to limit the rotation of the circular frame 200, a first positioning structure 130 is arranged on the internal edge of the circular opening 101, a second positioning structure 230 is correspondingly arranged at the external edge of the circular frame 200. According to the placing position of the casing 100, the circular frame 200 may be correspondingly rotated to one of a plurality of predetermined positions relative to the circular opening 101, and the circular frame 200 may be rotated from one of the predetermined positions to another predetermined position through an angle in multiples of 90 degrees. According to this embodiment, one of the predetermined positions is shown in FIG. 7 to FIG. 9, and another predetermined position is shown in FIG. 10. According to FIG. 9 to FIG. 10, when the circular frame 200 is located at any one of the predetermined positions, the first positioning structure 130 and the second positioning structure 230 may block each other along a circumferential direction of the circular opening 101 to prevent the circular frame 200 from an unexpected displacement.

According to the electronic device of this disclosure shown in FIG. 9 to FIG. 10, the first positioning structure 130 and the second positioning structure 230 may respectively have a block 132/232, when the circular frame 200 is located at a predetermined position which is at an end of a rotatable range, the pair of blocks 132/232 abut against each other and block each other unidirectionally along the circumferential direction of the circular opening 101 so as to prevent the cable from a damage caused by over twisting when the circular frame 200 is rotated out of a predetermined range.

Furthermore, the first positioning structure 130 may have a spherical tenon 131, and the second positioning structure 230 may have a positioning hole 231 for snapping the spherical tenon 131. When the circular frame 200 is located at any one of the predetermined positions in the rotatable range, the spherical tenon 131 snaps the positioning hole 231 along a direction parallel with a central axis of the circular opening 101, so that the circular frame 200 is positioned by the first positioning structure 130 and the second positioning structure 230 to be prevented from an unexpected rotation. The aforementioned spherical tenon 131 and the positioning hole 231 may be exchanged in position, namely the second positioning structure 230 may have a spherical tenon 131 and the first positioning structure 130 may have a positioning hole 231 for snapping the spherical tenon 131. Multiple spherical tenons 131 or multiple positioning holes 231 may be arranged according to an arrangement of the predetermined positions. A function of the spherical tenon 131 is that the spherical tenon 131 may slip out of the snapped positioning hole 231 to allow the rotation of the circular frame 200 when the user rotates the circular frame 200 with a sufficient torque.

According to the third embodiment of this disclosure, an electronic device having a casing 100, a circular frame 200 and a display 310 is provided. The third embodiment is similar to the first embodiment shown in FIG. 1.

According to FIG. 11 to FIG. 14, the casing 100 is of a cuboid shape, a panel 110 is arranged on a side of the casing 100, and the panel 110 is of a rectangular shape. A circular opening 101 is defined on the panel 110, and a first fixing structure 120 is arranged at an internal edge of the circular opening 101.

The circular frame 200 may be a circular ring, a circular plate or a cylinder, an exterior profile of the circular frame 200 is matched with an interior profile of the circular opening 101, the circular frame 200 is rotatably arranged in the circular opening 101 to close the circular opening 101. According to this embodiment, the circular frame 200 may be protruded from the panel 110 to facilitate the usage for the user of rotating the circular frame 200, but this disclosure is not limited to this embodiment. For example, the circular frame 200 may be disposed in a coplanar manner with the panel 110 or be recessed in the circular opening 101. A second fixing structure 220 is arranged at an external edge of the circular frame 200, the second fixing structure 220 snaps the first fixing structure 120 to fix the circular frame 200 on the casing 100.

Specific structures of the first fixing structure 120 and the second fixing structure 220 are described as follows. According to this embodiment, the second fixing structure 220 has a sliding latch 221, the first fixing structure 120 has a curve slot 121 arranged concentrically with the circular opening 101, the sliding latch 221 snaps the corresponding curve slot 121 so as to fix the circular frame 200 on the casing 100. When the circular frame 200 is rotated in the circular opening 101, the sliding latch 221 is slidable in each corresponding curve slot 121 to avoid the interference to a rotation of the circular frame 200.

The display 310 is embedded in the circular frame 200 and exposed on the panel 110, the display 310 may be provided with an electric connector 320 for electrically connecting to a main board (not shown in figures) of an electronic device via a cable (not shown in figures) to display information related to status of the electronic device, and an operating interface 330 electrically connected with the main board is arranged on the circular frame 200 for an operation to the electronic device by the user. The display 310, the electric connector 320 and the operating interface 330 may be arranged on a sub circuit board 301. The type of the operating interface 330 is not limited in this disclosure. For example, the operating interface 330 may be physical keys or a touch screen integrated with the interface display 310.

In order to limit the rotation of the circular frame 200, a first positioning structure 130 is arranged on the internal edge of the circular opening 101, a second positioning structure 230 is correspondingly arranged at the external edge of the circular frame 200, the circular frame 200 may be correspondingly rotated to one of a plurality of predetermined positions relative to the circular opening 101, and the circular frame 200 may be rotated from any of the predetermined positions to another predetermined position through an angle in multiples of 90 degrees. When the circular frame 200 is located at any one of the predetermined positions, the first positioning structure 130 and the second positioning structure 230 may block each other along a circumferential direction of the circular opening 101 to prevent the circular frame 200 from an unexpected displacement.

According to this embodiment, two ends of a rotatable range of the circular frame 200 respectively have a predetermined position, the first positioning structure 130 and the second positioning structure 230 may be buckled with each other along the circumferential direction of the circular opening 101 when the circular frame 200 is located at any one of the predetermined positions. The second fixing structure 220 and the second positioning structure 230 are disposed on the same rod extended from the circular frame 200 according to this embodiment, the sliding latch 221 of the second fixing structure 220 is disposed on a tip of the rod, the sliding latch 221 may be of a spherical shape to facilitate the buckling to the curve slot 121. Specifically, the first positioning structure 130 has a latched notch 133, the latched notch 133 has at least one neck opening 133a. According to this embodiment, two latched notches 133 are disposed corresponding to the two predetermined positions shown in FIG. 13 and FIG. 14, the two latched notches 133 respectively communicate with two ends of the curve slot 121 through the neck openings 133a, and the second positioning structure 230 has a cylinder 233 inserted in the curve slot 121 for buckling the latched notch 133. The cylinder 233 is formed on a middle segment of the rod and is movable along the curve slot 121 with the rotation of the circular frame 200. When the circular frame 200 is located at any one of the predetermined positions, the cylinder 233 may snap into the neck opening 133a of the latched notch 133 correspondingly so as to be fixed in the latched notch 133 to position the circular frame 200. When the user rotates the circular frame 200 with a sufficient torque, the cylinder 233 has a curved surface so that the cylinder 233 may slip out of the snapped latched notch 133 to allow the rotation of the circular frame 200. In this embodiment, alternatively, a latched notch 133 may be additionally arranged at a middle segment of the curve slot 121, and an angle in multiples of 90 degrees is defined between the adjacent latched notches 133 relative to a center of the circular opening 101.

According to the electronic device of this disclosure, the display 310 is rotatably arranged in the circular opening 101 on the casing 100 by the circular frame 200, so that the display 310 may be rotated according to various placing positions of the casing 100 to facilitate the usage for the user. According to the electronic device of this disclosure, the display 310 may be rotated without detaching the display 310, so that the user may be prevented from electric shock caused by touching exposed components. Further, the display 310 is not limited to be of a square shape.

While this disclosure has been described by means of specific embodiments, numerous modifications and variations could be made thereto by those skilled in the art without departing from the scope and spirit of this disclosure set forth in the claims.

What is claimed is:

1. An electronic device, comprising:
   a casing, comprising a panel arranged on a side thereof and a plurality of side plates adjacent to a periphery of the panel, a circular opening defined on the panel, and a first fixing structure arranged on an internal edge of the circular opening;
   a circular frame, rotatably arranged in the circular opening and closing the circular opening, a second fixing structure arranged on an external edge of the circular frame, the second fixing structure slidable with the circular frame and limited by the first fixing structure; and
   a display, embedded in the circular frame and exposed on the panel,
   wherein the casing is capable of being configured in a plurality of placements, the side plates are capable of being correspondingly configured as bottoms of the placements respectively, and the circular frame is rotatable to maintain the display at the same direction in the placements respectively so as to display an information in an upright direction;
   wherein the first fixing structure comprises a sliding latch and the second fixing structure correspondingly comprises a curve slot arranged concentrically with the circular frame, the second fixing structure comprises another sliding latch and the first fixing structure correspondingly comprises another curve slot arranged concentrically with the circular opening, and each latch correspondingly snaps each curve slot.

2. The electronic device according to claim 1, wherein the circular frame protrudes from the panel.

3. The electronic device according to claim 1, wherein an operating interface is arranged on the circular frame.

4. The electronic device according to claim 1, wherein the casing is of a cuboid shape and the panel is of a rectangular shape.

5. An electronic device, comprising:
   a casing, comprising a panel arranged on a side thereof and a plurality of side plates adjacent to a periphery of the panel, a circular opening defined on the panel, and a first fixing structure arranged on an internal edge of the circular opening;
   a circular frame, rotatably arranged in the circular opening and closing the circular opening, a second fixing structure arranged on an external edge of the circular frame, the second fixing structure slidable with the circular frame and limited by the first fixing structure; and
   a display, embedded in the circular frame and exposed on the panel, wherein the casing is capable of being configured in a plurality of placements, the side plates are capable of being correspondingly configured as bottoms of the placements respectively, and the circular frame is rotatable to maintain the display at the same direction in the placements respectively so as to display an information in an upright direction,
   wherein a first positioning structure is arranged on the internal edge of the circular opening, a second positioning structure is arranged on the external edge of the circular frame, the circular frame is rotatable with respect to the circular opening to one of a plurality of predetermined positions corresponding to the placing position, the first positioning structure and the second positioning structure block each other along a circumferential direction of the circular opening when the circular frame is located at any one of the predetermined positions;
   wherein the first positioning structure and the second positioning structure respectively comprise a block, when the circular frame is located at one of the predetermined positions, two blocks abut against each other and block each other unidirectionally along the circumferential direction of the circular opening.

6. The electronic device according to claim 5, wherein when the circular frame is located at one of the predetermined positions, the first positioning structure and the second positioning structure are buckled with each other along the circumferential direction of the circular opening.

7. The electronic device according to claim 5, wherein when the circular frame is located at any one of the predetermined positions, the first positioning structure and the second positioning structure are buckled with each other along an axial direction of the circular opening.

8. The electronic device according to claim 7, wherein the first positioning structure comprises a spherical tenon, and the second positioning structure comprises a positioning hole buckled with the spherical tenon.

9. The electronic device according to claim 7 wherein the second positioning structure comprises a spherical tenon, and the first positioning structure comprises a positioning hole buckled with the spherical tenon.

10. The electronic device according to claim 5, wherein the circular frame is rotatable from any one of the predetermined positions to another predetermined position by an angle in multiples of 90 degrees.

11. The electronic device according to claim 5, wherein the circular frame protrudes from the panel.

12. The electronic device according to claim 5, wherein an operating interface is arranged on the circular frame.

13. The electronic device according to claim 5, wherein the casing is of a cuboid shape and the panel is of a rectangular shape.

* * * * *